(12) United States Patent
Gaudet et al.

(10) Patent No.: US 7,959,970 B2
(45) Date of Patent: Jun. 14, 2011

(54) SYSTEM AND METHOD OF REMOVING CHAMBER RESIDUES FROM A PLASMA PROCESSING SYSTEM IN A DRY CLEANING PROCESS

(75) Inventors: Marcel Gaudet, Beacon, NY (US); Aelan Mosden, Poughkeepsie, NY (US); Robert J. Soave, LaGrangeville, NY (US)

(73) Assignee: Tokyo Electron Limited, Tokyo (JP)

( * ) Notice: Subject to any disclaimer, the term of this patent is extended or adjusted under 35 U.S.C. 154(b) by 440 days.

(21) Appl. No.: 10/813,390

(22) Filed: Mar. 31, 2004

(65) Prior Publication Data

US 2005/0224458 A1    Oct. 13, 2005

(51) Int. Cl.
*C23C 16/00* (2006.01)

(52) U.S. Cl. ........... 427/248.1; 427/255.28; 427/255.31; 118/715

(58) Field of Classification Search ............... 427/248.1, 427/255.28, 255.31; 118/715
See application file for complete search history.

(56) References Cited

U.S. PATENT DOCUMENTS

| | | | |
|---|---|---|---|
| 5,403,434 A * | 4/1995 | Moslehi | 134/1.2 |
| 5,993,679 A * | 11/1999 | Koide et al. | 216/74 |
| 6,057,247 A * | 5/2000 | Imai et al. | 438/714 |
| 6,545,245 B2 * | 4/2003 | Wei et al. | 219/121.41 |
| 7,041,608 B2 * | 5/2006 | Sieber et al. | 438/780 |
| 7,097,716 B2 * | 8/2006 | Barnes et al. | 134/26 |
| 2002/0148816 A1 * | 10/2002 | Jung et al. | 219/121.41 |
| 2004/0084409 A1 * | 5/2004 | Deshmukh et al. | 216/63 |
| 2004/0109263 A1 * | 6/2004 | Suda et al. | 360/322 |
| 2004/0168705 A1 * | 9/2004 | Sun et al. | 134/1.2 |

FOREIGN PATENT DOCUMENTS

JP    2000-195830    7/2000

OTHER PUBLICATIONS

Office Action issued Oct. 26, 2010, in Japan Patent Application No. 2007-506148 (English-language Translation only).

* cited by examiner

*Primary Examiner* — Timothy H Meeks
*Assistant Examiner* — Kelly M Gambetta
(74) *Attorney, Agent, or Firm* — Oblon, Spivak, McClelland, Maier & Neustadt, L.L.P.

(57) ABSTRACT

A system and method is provided for removing chamber residues from a plasma processing system in a dry cleaning process. The dry cleaning process includes introducing a process gas including a gas containing carbon and oxygen in a process chamber of the plasma processing system, generating a plasma from the process gas, exposing the chamber residue to the plasma in a dry cleaning process to form a volatile reaction product, and exhausting the reaction product from the process chamber. The plasma processing system may be monitored to determine status of the processing system, and based upon the status from the monitoring, the method includes either continuing the exposing and monitoring, or stopping the dry cleaning process. The dry cleaning process can be a waferless dry cleaning (WDC) process, or a substrate may present on the substrate holder in the process chamber during the dry cleaning process.

23 Claims, 10 Drawing Sheets

SYSTEM AND METHOD OF REMOVING CHAMBER RESIDUES FROM A PLASMA PROCESSING SYSTEM IN A DRY CLEANING PROCESS

FIELD OF THE INVENTION

The present invention is related to plasma processing, particularly to removing chamber residues from a plasma processing system in a dry cleaning process.

BACKGROUND OF THE INVENTION

Plasma processing systems are used in the manufacture and processing of semiconductors, integrated circuits, displays, and other devices to both remove and deposit materials on a substrate such as a semiconductor wafer. Plasma processing of semiconductor substrates to transfer a pattern of an integrated circuit from the photolithographic mask to the substrate, or to deposit dielectric or conductive films on the substrate, have become standard methods in the industry.

Halogen-containing and carbon-containing gases are commonly used to etch dielectric layers such as oxides and newer low-dielectric constant (k) materials. These gases are known to generate fluorocarbon polymer reaction products, that can deposit on internal surfaces of a process chamber including chamber components and chamber walls. Over time, these residues can accumulate in the process chamber and may eventually flake off, thereby generating particle contamination in the process chamber and on processed substrates. Furthermore, these residues and fluorine radicals in the process environment begin to participate in the etch process in ways that can affect the etch rate, etch profile, critical-dimension control, wafer uniformity and selectivity. This is commonly referred to as the fluorine/polymer memory effect.

To control the amount of chamber residues, plasma processing systems must be periodically shut down for scheduled, and sometimes unscheduled, wet chamber cleans. Wet cleans reduce system availability, lower productivity, and add the cost of non-production (dummy) wafers for chamber conditioning to production expenses, all of which increase the system cost of ownership. The mean time between wet cleans (MTBWC), measured either by the number of wafers processed or as cumulative etch time, can be extended if the process chamber can be dry cleaned by an in-situ plasma cleaning process. However, conventional dry cleaning processes may not be effective in removing residue from the chamber interior. Moreover, conventional dry cleaning processes involve an aggressive chemical reaction that requires a wafer present on a substrate holder of the chamber in order to "shield" the sensitive materials of the substrate holder from being damaged by the dry cleaning process. This use of a substrate during dry cleaning decreases throughput of the chamber because shield substrates must be loaded into and removed from the chamber in order to perform the dry cleaning. The shield substrate also prevents the dry cleaning process from effectively cleaning residue from the substrate holder. The present inventors have recognized that this failure to remove residue from the substrate holder not only contributes to particle contamination as noted above, but also can cause arcing in electrostatic chucks, and otherwise prevent proper operation of this type of substrate holder.

SUMMARY OF THE INVENTION

Accordingly, an object of the present invention is to solve or reduce the above-noted problems associated with in-situ chamber dry cleaning processes.

Another object of the present invention is to provide an improved dry cleaning process.

Another object of the present invention is to provide an effective dry cleaning process that can be performed without having a wafer present in the processing chamber.

These and/or other objects may be provided by a method is for removing a chamber residue from a plasma processing system in a dry cleaning process. The dry cleaning process includes introducing a process gas including a gas containing carbon and oxygen into a process chamber of the plasma processing system, generating a plasma from the process gas, exposing the chamber residue to the plasma in a dry cleaning process to form a volatile reaction product, and exhausting the reaction product from the process chamber.

In one embodiment of the invention, the plasma processing system may be monitored to determine status of the dry cleaning process, and based upon the status from the monitoring, the method includes either continuing the exposing and monitoring, or stopping the dry cleaning process.

In one embodiment of the invention, the dry cleaning process can be a waferless dry cleaning (WDC) process. In another embodiment of the invention, a substrate may present on a substrate holder in the process chamber during the dry cleaning process.

DETAILED DESCRIPTION OF EMBODIMENTS OF THE INVENTION

Figure 1:
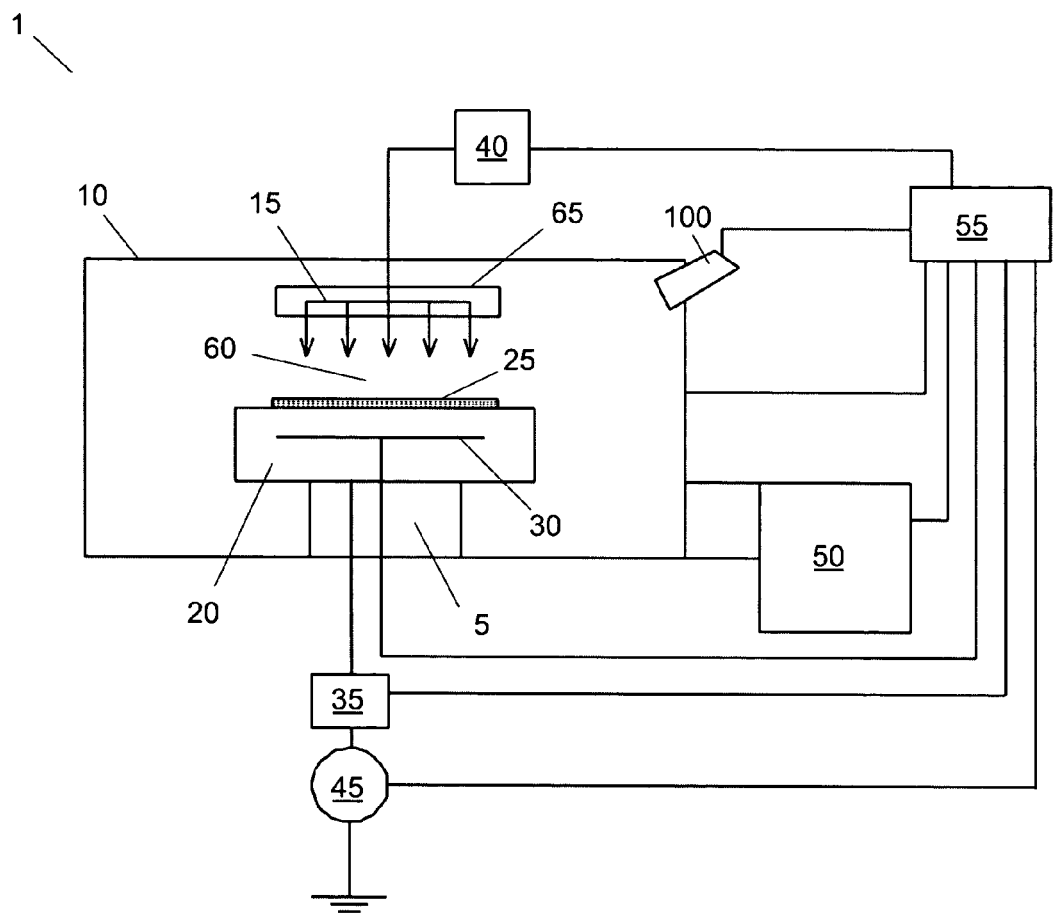
FIGS. 1-4 show plasma processing systems according to embodiments of the invention.

FIGS. 1-4 show plasma processing systems according to embodiments of the invention. FIG. 1 shows a plasma processing system according to one embodiment of the invention. The plasma processing system 1 includes a process chamber 10 having a pedestal 5 for mounting a substrate holder 20 for supporting a substrate 25, a gas injection system 40 for introducing a process gas 15 to the process chamber 10, a chamber monitoring system 100, and a vacuum pumping system 50. The chamber monitoring system 100 can, for example, be an optical monitoring system for monitoring light emission from a plasma in the process chamber 10, a particle monitoring system for monitoring particle levels in the process chamber 10, or a mass sensor for monitoring the gaseous environment in the process chamber 10.

The process gas 15 can, for example, be a halogen-containing and carbon-containing etch gas for etching the substrate 25 in a manufacturing process where a microelectronic device is formed, or a gas for removing a chamber residue from the process chamber 10 in a plasma dry cleaning process. According to the present invention, the process gas for removing the chamber residue can include a gas containing carbon and oxygen. The gas injection system 40 allows independent control over the delivery of the process gas 15 to the process chamber 10 from ex-situ gas sources. The process gas 15 can be introduced to the processing region 60 through a gas injection plenum (not shown), a series of baffle plates (not shown), and a multi-orifice showerhead gas injection plate 65, and the pressure in the process chamber adjusted. For example, controller 55 is used to control the vacuum pumping system 50 and gas injection system 40.

Substrate 25 is transferred into and out of chamber 10 through a slot valve and chamber feed-through via a robotic substrate transfer system where it is received by substrate lift pins housed within substrate holder 20 and mechanically translated by devices housed therein. Once the substrate 25 is received from the substrate transfer system, it is lowered to an upper surface of the substrate holder 20. The substrate 25 can, for example, include semiconductor substrates such as silicon (Si) and compound semiconductors (e.g., GaAs), liquid crystal display (LCD) substrates, glass substrates, and ceramic materials such as silicon nitride (SiN), silicon carbide (SiC), and alumina ($Al_2O_3$). The plasma processing system 1 can be configured to process substrates of various sizes, for example 200 mm substrates, 300 mm substrates, or larger substrates.

The substrate 25 can be affixed to the substrate holder 20 via an electrostatic clamp or a mechanical clamp. Furthermore, the substrate holder 20 can further include a cooling system including a re-circulating coolant flow that receives heat from the substrate holder 20 and transfers heat to a heat exchanger system. Alternately, the substrate holder 20 may include a recirculating fluid flow that supplies heat to the substrate holder 20 from a heat exchanger system. Moreover, gas may be delivered to the backside of the substrate to improve the gas-gap thermal conductance between the substrate 25 and the substrate holder 20. Such a system is utilized when temperature control of the substrate is required at elevated or reduced temperatures.

The substrate holder 20 can contain a heating element 30. The heating element 30 can, for example, be a resistive heating element. Vacuum pump system 50 can include a turbomolecular vacuum pump (TMP) capable of a pumping speed up to 5,000 liters per second (and greater), and a gate valve for throttling the chamber pressure. TMPs are useful for low pressure processing, typically less than 800 mTorr. For high pressure processing (i.e., greater than about 800 mTorr), a mechanical booster pump and dry roughing pump can be used.

The plasma processing system 1 is capable of forming and sustaining a plasma in the process chamber 10. The plasma processing system 1 can, for example, be utilized for performing a plasma enhanced chemical vapor deposition process (PECVD), or a plasma etch process. The substrate holder 20 can further serve as an electrode through which radio frequency (RF) power is coupled to plasma in the processing region 60. For example, a metal electrode in the substrate holder 20 can be electrically biased at a RF voltage via the transmission of RF power from a RF generator 45 through an impedance match network 35 to the substrate holder 20. The RF bias serves to excite electrons and, thereby, form and sustain a plasma. In this configuration, plasma is utilized to either deposit material to a substrate 25 (i.e., the processing system 1 can act as a PECVD reactor), or to remove material from the exposed surface of the substrate 25 (i.e., the processing system 1 can act as a reactive ion etching (RIE) reactor). A typical frequency for the RF bias can be between about 0.5 MHz and about 200 MHz and can be 2 MHz.

The impedance match network 35 serves to maximize the transfer of RF power to plasma in processing chamber 10 by minimizing the reflected power. Match network topologies (e.g., L-type, π-type, T-type) and automatic control methods are known in the art. In an alternate embodiment, RF power can be applied to the substrate holder 20 at multiple frequencies.

In FIG. 1, the controller 55 includes a microprocessor, a memory, and a digital I/O port capable of generating control voltages sufficient to communicate and activate inputs to the plasma processing system 1 as well as monitor outputs from the plasma processing system 1. Furthermore, the controller 55 is coupled to and exchanges information with the process chamber 10, the RF generator 45, the impedance match network 35, the gas injection system 40, the chamber monitoring system 100, and the vacuum pump system 50. For example, a program stored in the memory can be utilized to control the aforementioned components of a processing system 1 according to a stored process recipe. One example of controller 55 is a digital signal processor (DSP); model number TMS320, available from Texas Instruments, Dallas, Tex.

Figure 2:
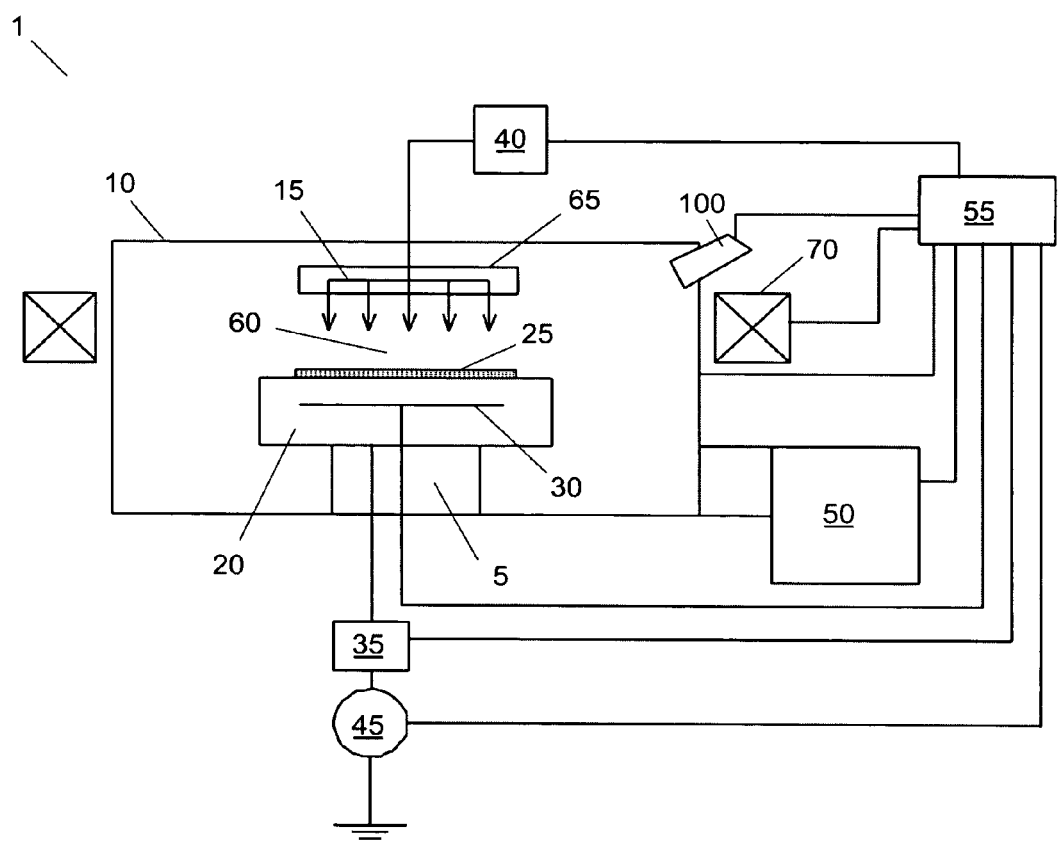

FIG. 2 shows a plasma processing system according to one embodiment of the invention. The plasma processing system 1 of FIG. 2 further includes a mechanically or electrically rotating DC magnetic field system 70, in order to potentially increase plasma density and/or improve plasma processing uniformity, in addition to those components described with reference to FIG. 1. Moreover, the controller 55 is coupled to the rotating magnetic field system 70 in order to regulate the speed of rotation and field strength.

Figure 3:
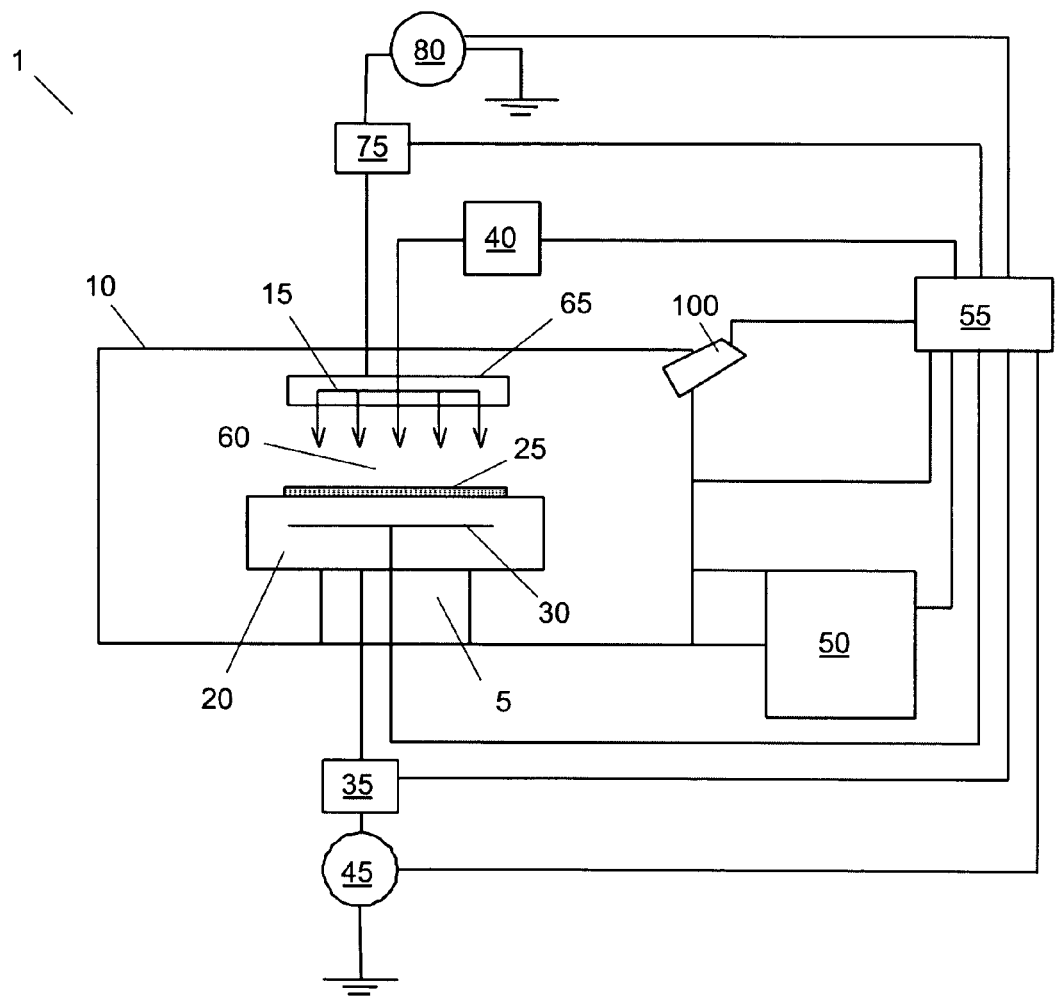

FIG. 3 shows a plasma processing system according to one embodiment of the invention. The plasma processing system 1 of FIG. 3 includes an multi-orifice showerhead gas injection plate 65 that can also serve as an upper plate electrode to which RF power is coupled from an RF generator 80 through an impedance match network 75. A typical frequency for the application of RF power to the upper electrode can be between about 10 MHz and about 200 MHz and can be 60 MHz. Additionally, a typical frequency for the application of power to the lower electrode can be between about 0.1 MHz and about 30 MHz and can be 2 MHz. Moreover, the controller 55 is coupled to the RF generator 80 and the impedance match network 75 in order to control the application of RF power to the upper electrode 65.

In one embodiment of the invention, the substrate holder 20 in FIG. 3 can be electrically grounded. In an alternate embodiment, a DC bias can be applied to the substrate holder 20. In still another embodiment, the substrate holder 20 can be electrically isolated from the plasma processing system 1 and a floating potential may be formed on the substrate holder 20 and on the substrate 25 when the plasma is on.

Figure 4:
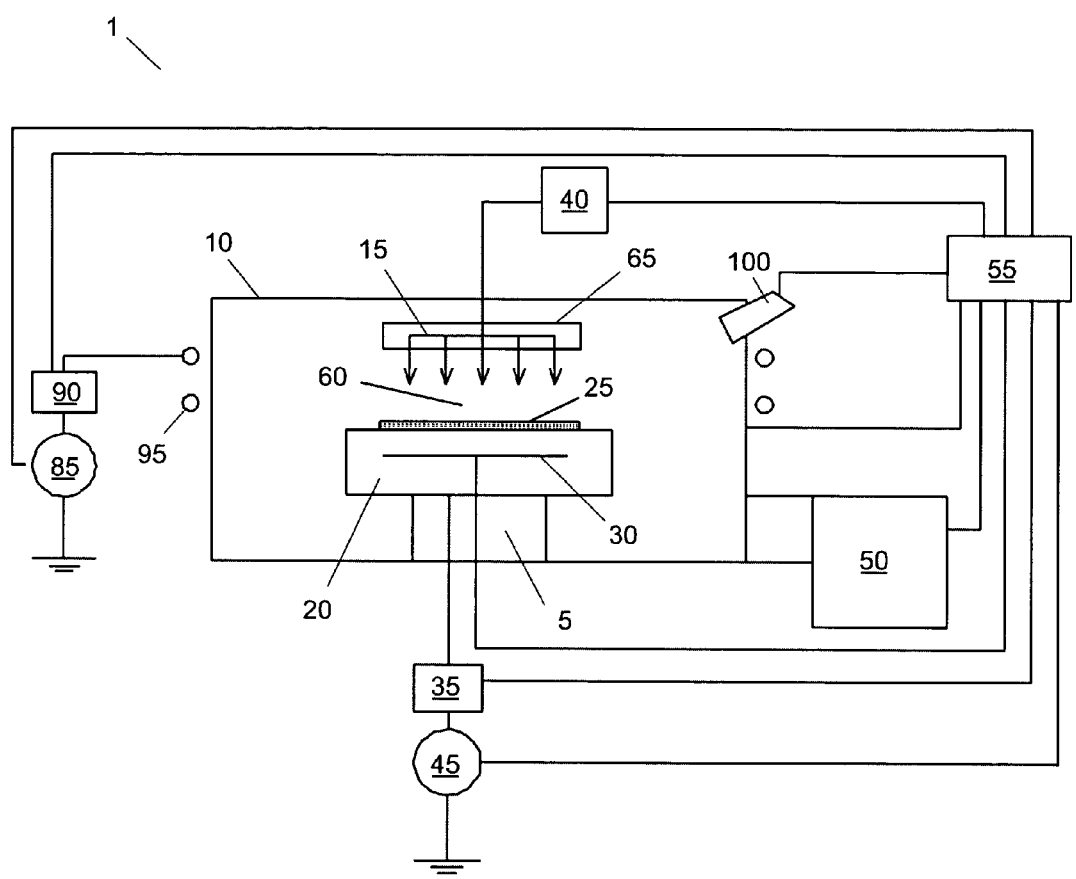

FIG. 4 shows a plasma processing system according to one embodiment of the present invention. The plasma processing system of FIG. 2 is modified to further include an inductive coil 95 to which RF power is coupled via an RF generator 85 through an impedance match network 90. RF power is inductively coupled from the inductive coil 95 through a dielectric window to the processing region 60. A typical frequency for the application of RF power to the inductive coil 80 can be between about 10 MHz and about 100 MHz and can be 13.56 MHz. Similarly, a typical frequency for the application of power to the substrate holder 20 can be between about 0.1 MHz and about 30 MHz and can be 13.56 MHz. In addition, a slotted Faraday shield can be employed to reduce capacitive coupling between the inductive coil 95 and plasma. Moreover, the controller 55 is coupled to the RF generator 85 and the impedance match network 90 in order to control the application of power to the inductive coil 95.

In one embodiment of the invention, the substrate holder 20 in FIG. 4 can be electrically grounded. In an alternate embodiment, a DC bias can be applied to the substrate holder 20. In still another embodiment, the substrate holder 20 can be electrically isolated from the plasma processing system 1 and a floating potential may be formed on the substrate holder 20 and on the substrate 25 when the plasma is on.

In another embodiment of the present invention, the plasma is formed using electron cyclotron resonance (ECR). In yet another embodiment, the plasma is formed from the launching of a Helicon wave. In still another embodiment, the plasma is formed from a propagating surface wave.

It is to be understood that the plasma processing systems in FIGS. 1-4 are for exemplary purposes only, as many variations of the specific hardware and software can be used to implement systems in which the present invention may be practiced, and these variations will be readily apparent to one having ordinary skill in the art.

As discussed above, conventional dry cleaning processes may not be effective in removing residue from the chamber interior, and generally require the use of a shield substrate to prevent the dry cleaning process from damaging the substrate holder. The present inventors have discovered a dry cleaning process that is effective in cleaning residue from a processing chamber, yet less harmful to the substrate holder so that the process can be performed without a shield substrate. This ability to perform dry cleaning without a shield substrate allows more effective cleaning of the substrate holder which can provide improved operation of electrostatic chuck type substrate holders. The dry cleaning process of the present invention may be used to clean any of the plasma processing systems described with respect to FIGS. 1-4.

In one embodiment of the present invention, a method is provided for removing a chamber residue from a plasma processing system utilizing a plasma and a process gas that includes a gas containing carbon and oxygen. The dry cleaning process can be carried out after processing at least one production substrate (wafer), and the dry cleaning process may be performed without a substrate on the substrate holder (wafer chuck). This is referred to as a waterless dry cleaning (WDC) process. A WDC process can effectively remove residues from the substrate holder, as well as other chamber components and the chamber walls. Moreover, when utilizing a WDC process, the absence of wafer loading and unloading time periods during the cleaning process can reduce cleaning times and increase manufacturing throughput. The present invention also provides improved chamber cleaning over conventional dry cleaning processes even when a (non-production) substrate may be present on the substrate holder during the dry cleaning process in order to shield the substrate holder from the plasma environment as will be further described below.

According to the present invention, the dry cleaning process can be performed after each manufacturing process or, alternately, after more than one manufacturing process has been performed in the process chamber. After a dry cleaning process, when the next manufacturing substrate is transferred to the process chamber and processed, the substrate can face similar chamber conditions as the previous manufacturing substrate did. Thus, substrate to substrate variations can be minimized.

The gas containing carbon and oxygen can be selected from a wide variety of gases, including carbon monoxide (CO), carbon dioxide ($CO_2$), an alcohol (ROH), an aldehyde (RCHO), and a ketone ($R_1COR_2$). The alcohol can contain linear carbon chains, for example, methanol ($CH_3OH$), ethanol ($CH_3CH_2OH$), propanol ($CH_3CH_2CH_2OH$), and branched carbon chains, for example 2-propanol (($CH_3$)$_2$CHOH) and tert-butyl alcohol (($CH_3$)$_3$COH). The process gas can further contain at least one of hydrogen ($H_2$), ammonia ($NH_3$), water ($H_2O$), nitrogen ($N_2$), and an inert gas such as argon (Ar), helium (He), or xenon (Xe). As used herein, the term "at least one of a, b, c . . . or x" refers to any one of the listed elements, or any combination of more than one listed element.

According to one embodiment of the invention, the dry cleaning process can be carried out for a predetermined amount of time that is known to result in a clean chamber or, alternately, the end of the dry cleaning process can be determined using endpoint detection methods. In this regard, it is to be understood that an acceptable level of cleanliness may vary depending on the production process to be performed in the process chamber. One possible method of endpoint detection is to use an optical monitoring system to monitor a portion of the emitted light spectrum from the plasma region that indicates when all (or substantially all) of the chamber residue has been removed from the process chamber, thereby providing information on the status of the dry cleaning process.

For example, portions of the spectrum that indicate such a removal have wavelengths of 482.5 nm (carbon monoxide, CO), 775.5 nm (fluorine, F), and 440 nm (silicon tetrafluoride, $SiF_4$), and can be measured using Optical Emission Spectroscopy (OES). Fluorine light emission at 775.5 nm can indicate relative amount of fluorine radicals in the plasma environment (i.e., fluorine memory effect) and the amount of a fluorine-containing chamber residue in the process chamber. CO emission at 482.5 nm can be related to release of polymer residue from chamber components and other surfaces in the process chamber. After emission levels corresponding to those frequencies cross a specified threshold (e.g., drop to substantially zero or decrease below a particular level), the dry cleaning process can be considered to be complete.

Another method of endpoint detection includes using a mass sensor to monitor the gaseous environment in the process chamber. Still another method of endpoint detection is to monitor operating parameters of the plasma processing system, including RF generator peak-to-peak voltage and capacitor position in the impedance match network. Yet another method of endpoint detection is to monitor particle levels in the process chamber using a particle monitoring system.

Figure 5:
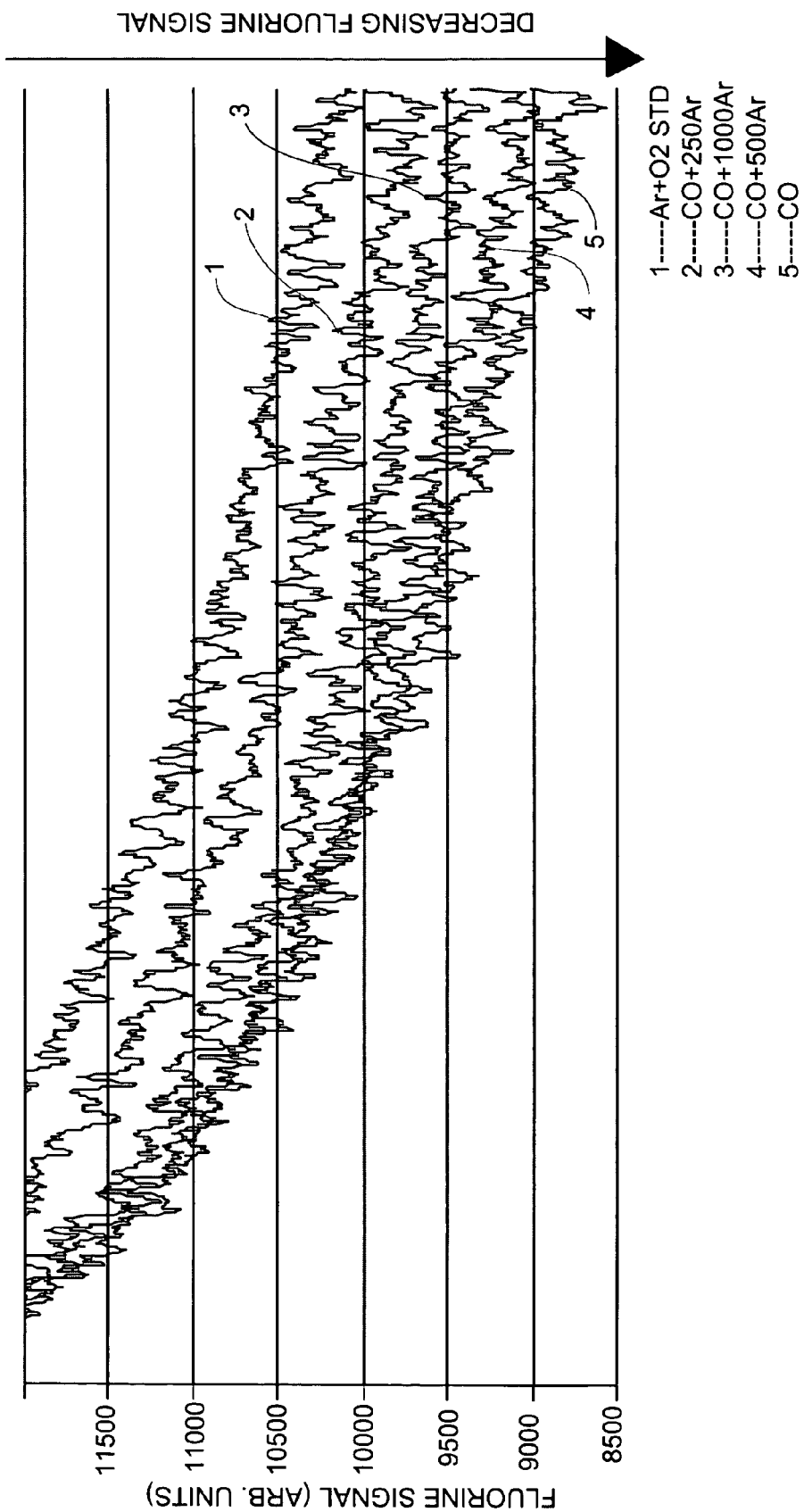
FIGS. 5-7 show of changes in light emission from performing WDC processes in a plasma processing system according to embodiments of the invention.
Figure 6:
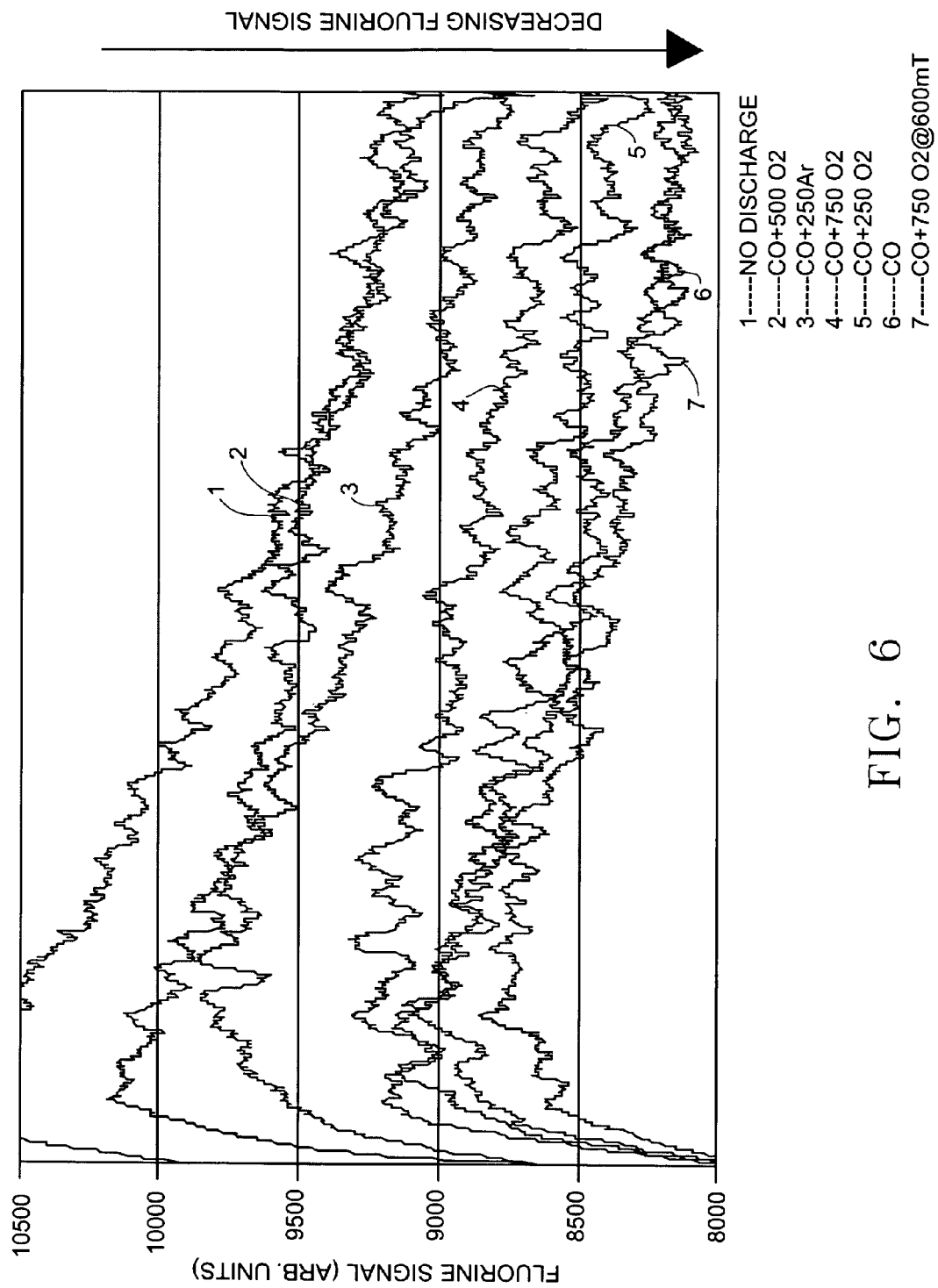
Figure 7:
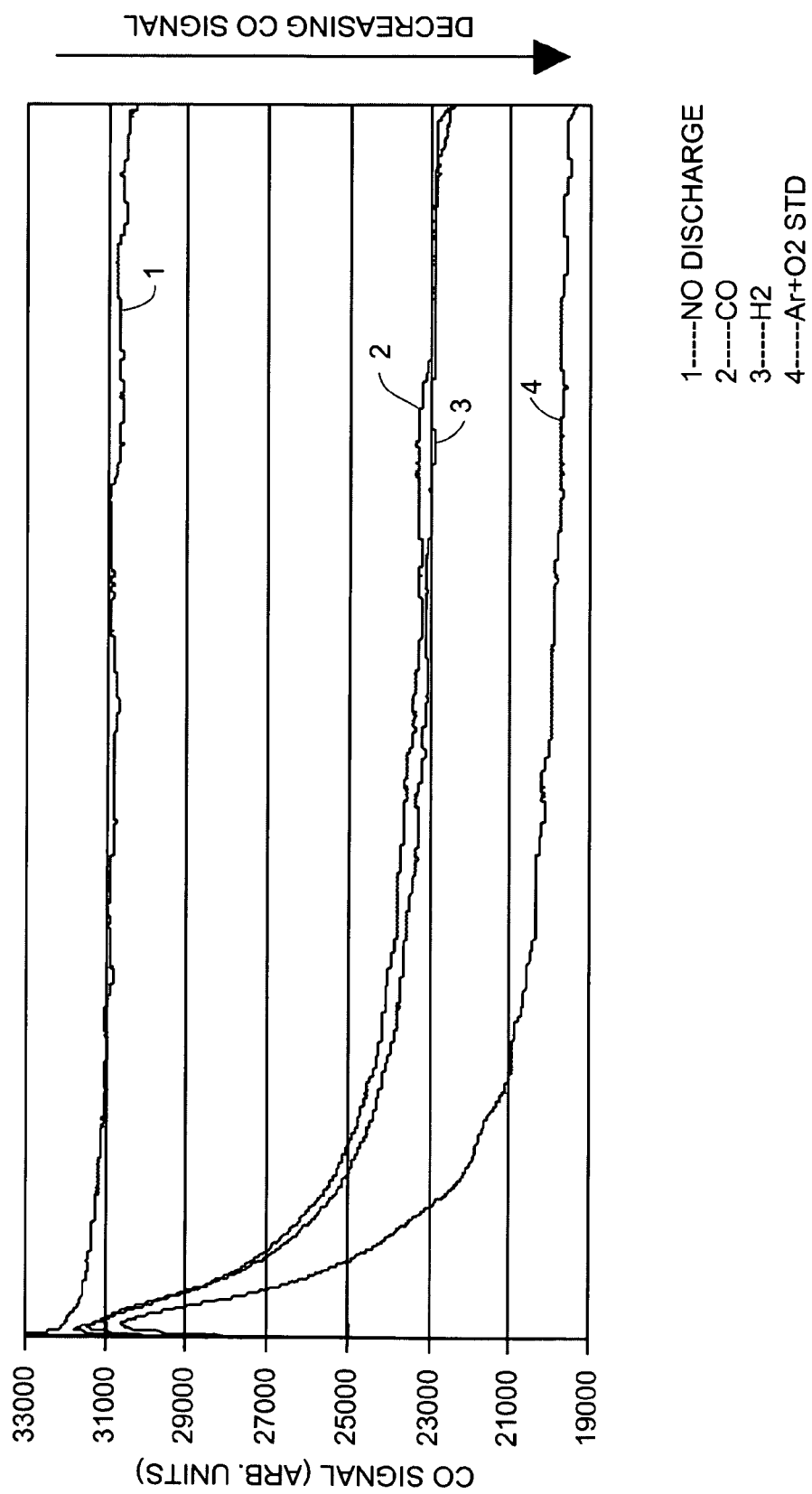

FIGS. 5-7 show changes in light emission from performing WDC processes in a plasma processing system according to embodiments of the invention. These figures demonstrate the effectiveness of the present invention in removing residue from the chamber interior. The plasma processing system used to generate the data of FIGS. 5-7 is schematically shown in the above-described FIG. 3. The plasma conditions included a chamber pressure of 100 mTorr, an upper electrode RF power of 750 W at 60 MHz, and a lower electrode RF power of 250 W at 2 MHz. Plasma light emission was monitored from the processing region to evaluate the WDC processes for different process gases and process gas mixtures. Each curve in FIGS. 5-7 shows the difference between an initial light emission measurement taken of a chamber and a light emission measurement taken after 3 cycles of an etch and dry cleaning process are performed. Specifically, an initial light emission was detected, using a 3 minute OES scan, from a plasma containing an Ar+$O_2$ process gas (in the presence of a clean Si wafer on the substrate holder). Then the following process sequence was performed three times: a) performing a plasma etch process developed for a low-k material or a planarizing material in the presence of a Si substrate (wafer) on the substrate holder, and b) performing a 30 sec WDC plasma process. The plasma etch process results in chamber residue being deposited on the chamber interior. Then another light emission measurement was detected using a 3 minute OES scan, from a plasma containing an $Ar+O_2$ process gas (in the presence of a clean Si wafer on the substrate holder) to determine the amount of residue in the chamber after the etching and cleaning cycles. The difference between the initial measurement and the post-cleaning measurement is shown as each of the five curves in FIGS. 5-7. The horizontal axis of these curves represents the 3 min OES scan.

FIG. 5 shows changes in fluorine signal at 775.5 nm according to an embodiment of the invention. The curves in FIG. 5 correspond to WDC processes utilizing a CO gas flow rate of 500 standard cubic centimeters per minute (sccm) and Ar gas flow rates of 0 sccm, 250 sccm, 500 sccm, and 1000 sccm. A WDC process utilizing a $Ar+O_2$ plasma cleaning process with an Ar gas flow rate of 750 sccm and $O_2$ gas flow rate 750 sccm is also shown. The results in FIG. 5 show that WDC processes utilizing pure CO gas or CO+Ar gases resulted in reduced fluorine signals, and therefore reduced chamber deposits, in the process chamber, when compared to the conventional $Ar+O_2$ dry cleaning plasma process. When Ar was used with CO, equal gas flows of CO and Ar (500 sccm each) resulted in the lowest fluorine signal.

FIG. 6 shows changes in fluorine signal at 775.5 nm according to an embodiment of the invention. The curves in FIG. 6 correspond to WDC processes utilizing a CO gas flow rates of 500 sccm and $O_2$ gas flow rates of 0 sccm, 250 sccm, 500 sccm, and 750 sccm. The results in FIG. 6 show that a WDC processes at a chamber pressure of 100 mTorr utilizing pure CO without any additional $O_2$, was most effective in reducing the fluorine signal in the process chamber. FIG. 6 shows that a WDC process performed at a chamber pressure of 600 mTorr, utilizing a CO gas flow rate of 500 sccm and $O_2$ gas flow rate of 750 sccm, yielded similar fluorine signal as pure CO at a chamber pressure of 100 mTorr. Furthermore, the results in FIG. 6 show that the reduction in the fluorine signal was not a linear function of the $O_2$ gas flow rate.

FIG. 7 shows changes in CO signal at 482.5 nm according to an embodiment of the invention. The results in FIG. 7 show that a WDC process utilizing pure CO gas yields CO light emission that is comparable to the conventional $Ar+O_2$ dry cleaning plasma process. Furthermore, FIG. 7 shows the effects of not performing a WDC process (no discharge), and the effects of performing a WDC process using pure $H_2$ gas.

According to the present invention, the process parameter space for the dry cleaning process can, for example, utilize a chamber pressure between about 10 mTorr and about 5 Torr. In another embodiment of the invention, the chamber pressure can be between about 20 mTorr and about 1 Torr and can be about 100 mTorr. A typical frequency for the RF power on the upper and lower electrodes in FIG. 3 can be between about 1 MHz and about 100 MHz. For example, the upper electrode RF power can be between about 100 W to about 4,000 W, preferably about 750 W at 60 MHz. Furthermore, the lower electrode RF power can be between about 0 W and about 4,000 W, can be about 250 W at 2 MHz. A process gas flow rate of between about 100 sccm and about 5,000 sccm can be used. Furthermore, a gas flow rate between about 100 sccm and about 2,000 sccm can be used for the gas containing carbon and oxygen, a gas flow rate of between about 20 sccm and about 1,000 sccm can be used for $H_2$, $H_2O$, $NH_3$, and $N_2$, and a gas flow rate of less than about 2,000 sccm can be used for an inert gas.

Furthermore, the chamber pressure and the composition of the process gas can be varied during the plasma cleaning process. The time duration for the plasma cleaning should be sufficiently long to substantially reduce the amount of fluorocarbon chamber residue in the process chamber. The time duration for the cleaning process can, for example, be between about 2 seconds and about 240 seconds. Alternately, the time duration can be between about 15 seconds and about 40 seconds.

Figure 8:
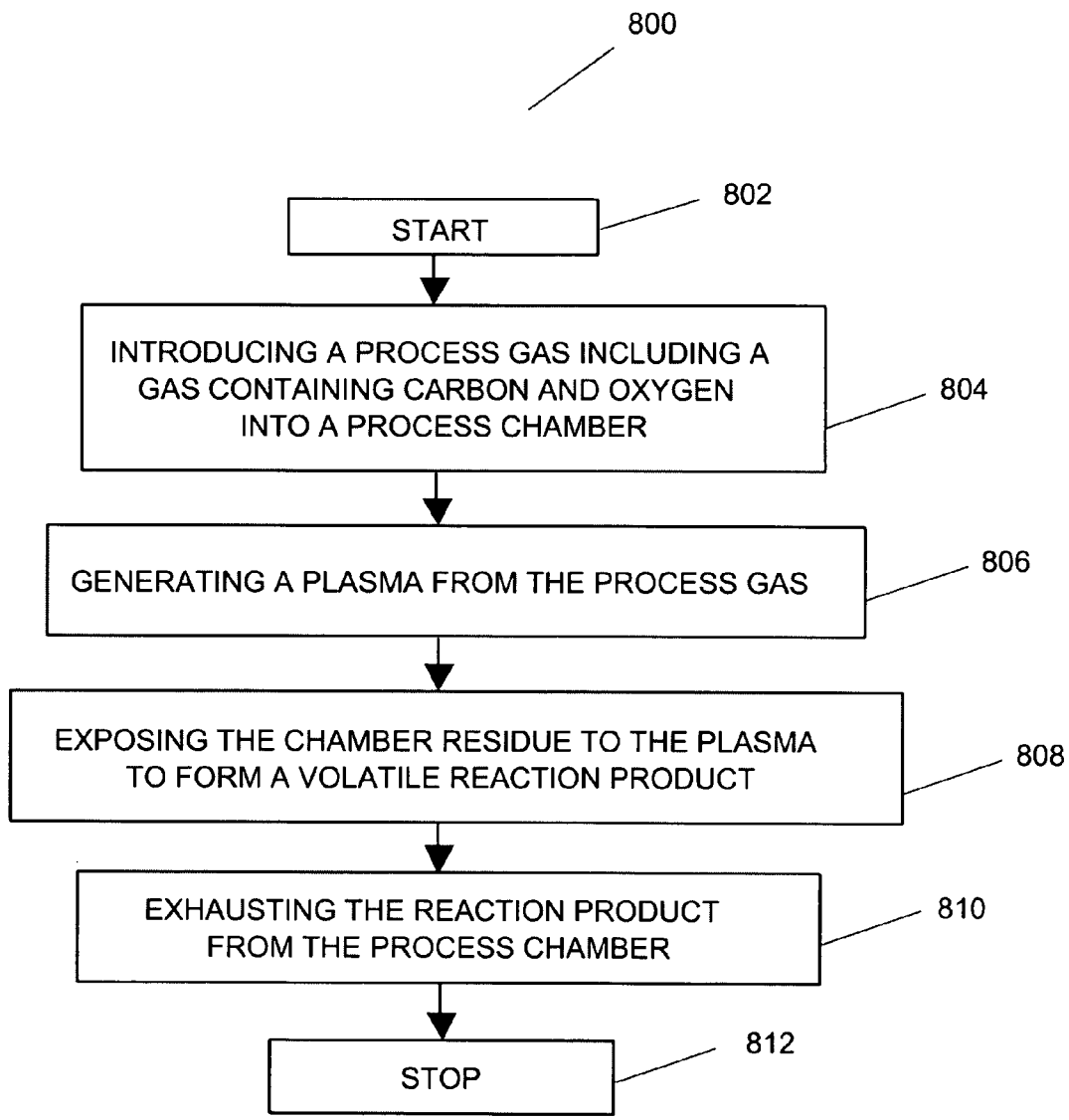
FIG. 8 is a flowchart showing a method of removing a chamber residue from a process chamber of a plasma processing system in accordance with an embodiment of the invention.

FIG. 8 is a flowchart showing a method of removing a chamber residue from a process chamber of a plasma processing system in accordance with an embodiment of the invention. At 802, the cleaning process 800 is started. At 804, a process gas including a gas containing carbon and oxygen is introduced in a process chamber of the plasma processing system. At 806, a plasma is generated from the process gas. At 808, the chamber residue is exposed to the plasma in a dry cleaning process to form a volatile reaction product. At 810, the reaction product is exhausted from the processing system, and at 812, the process is stopped.

Figure 9:
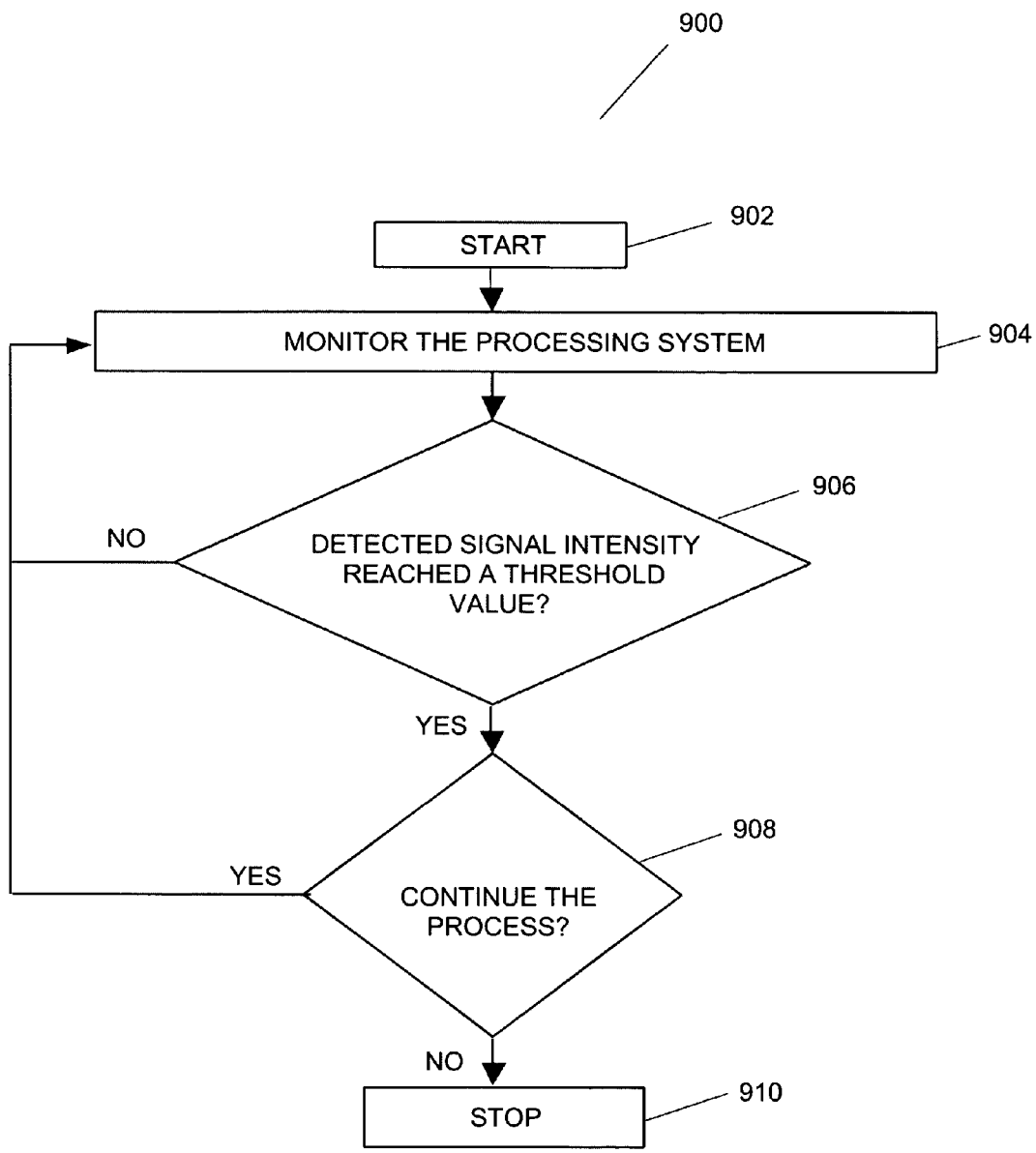
FIG. 9 is a flowchart showing a method of monitoring and controlling the plasma processing system in accordance with an embodiment of the invention.

FIG. 9 is a flowchart showing a method of monitoring and controlling the plasma processing system in accordance with an embodiment of the invention. The process 900 may be the monitoring and controlling of the dry cleaning process 800 that is described above. At 902, the process is started. At 904, the plasma processing system is monitored by a chamber monitoring system. The monitoring can, for example, be based on a light emission signal or a light absorption signal from a gas in the processing environment, a mass signal from the cleaning gas and/or a volatile reaction product, a particle level, or a process parameter. During the cleaning process, the chamber residue is removed from the process chamber (including from chamber components and other surfaces within the process chamber). This can alter the monitored signal as the process continues in the process chamber. This change in the signal can be detected by the monitoring system and correlated to the status of the process chamber. At 906, if the detected signal intensity has not reached a threshold value, the process 900 is continued at 904, or if the signal in 906 has reached a threshold value, a decision is made in 908 whether to continue the process 800 or to stop the process in 910.

A signal intensity can be monitored to determine an endpoint of a cleaning process. Correlation of a signal intensity to an endpoint of a dry cleaning process can be carried out by a test process that is performed while detecting a signal intensity and monitoring status of a process chamber. Status of a process chamber can, for example, be evaluated by inspecting a chamber component during the test process and correlating the inspected results to a detected threshold intensity recorded when a desired endpoint of the dry cleaning process is observed. The threshold intensity may be a fixed intensity value, or a ratio of measured signal intensity and initial signal intensity (measured at the start of the process).

Figure 10:
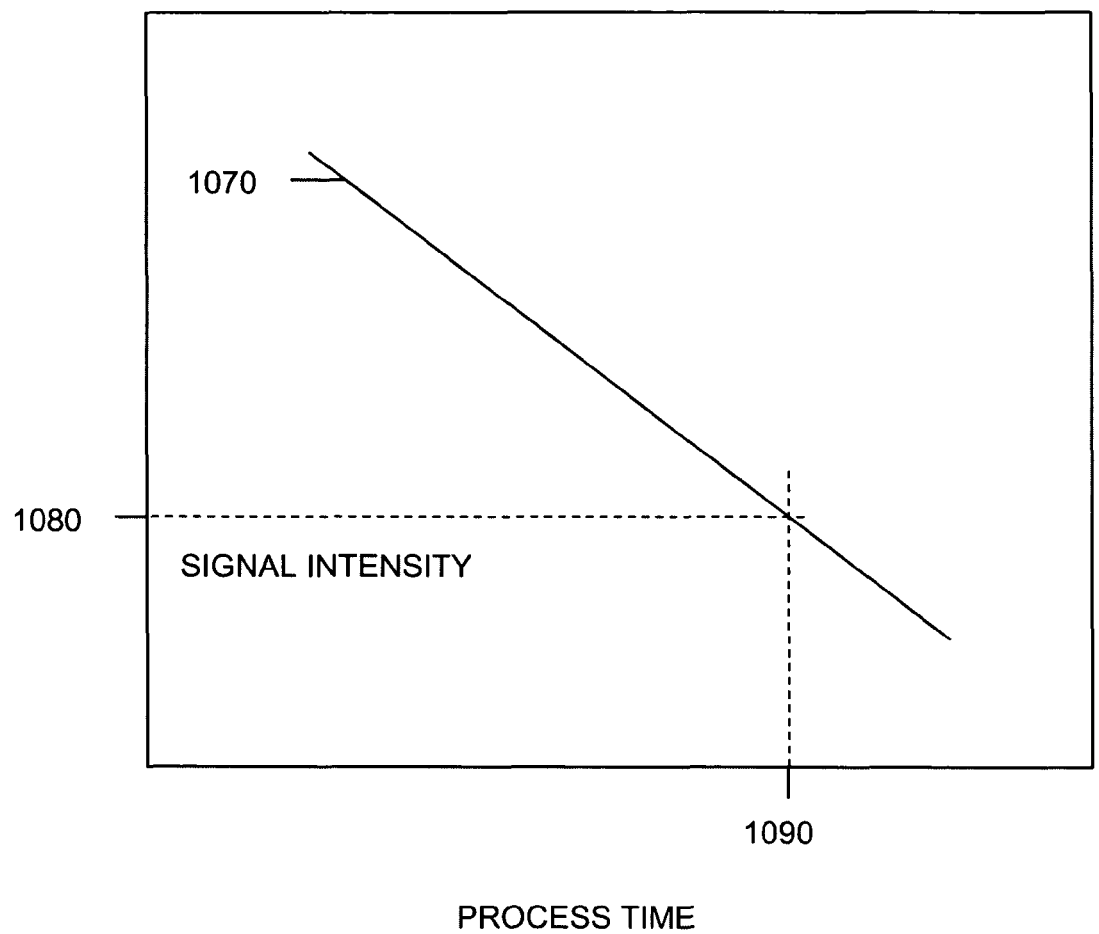
FIG. 10 is a graph showing signal intensity as a function of processing time for monitoring status of a plasma processing system in accordance with an embodiment of the invention.

FIG. 10 is a graph showing signal intensity as a function of processing time for monitoring status of a plasma processing system in accordance with an embodiment of the invention. The signal can, for example, be a light emission signal (e.g., a fluorine signal at 482.5 nm, a CO signal at 775.5 nm, or a silicon tetrafluoride signal at 440 nm), a mass signal from a cleaning gas and/or a reaction product (e.g., $SiF_4$), a plasma parameter, or a particle level. As seen by the curve 1070, the detected signal intensity generally decreases as the dry cleaning process takes place, due to removal of a chamber residue from the process chamber and decreasing amount of the chamber residue in the process chamber. While the curve 1070 in FIG. 10 shows a substantial linear decrease in signal intensity, it is to be understood that the signal intensity curve depends on the characteristics of the cleaning process and may be non-linear. As also seen in FIG. 10, a threshold intensity 1080 is detected at time 1090 when the chamber component is known to be at an acceptable clean level for a desired process. It is to be understood that an acceptable clean level may vary depending on the production process to be performed in the chamber.

Returning to FIG. 9, as the signal intensity is detected at 904 during the dry cleaning process, the controller compares at 906 the detected signal intensity with prior stored signal intensity, and determines whether the detected signal intensity has reached the predetermined threshold intensity. When the signal threshold intensity is not yet detected, the monitoring returns to 904, and the process continues. When the threshold signal intensity is detected, a decision is made in 908 whether to continue the process in 904, or to stop the process in 908. Alternately, the decision in 908 to continue the process may include adjustment of process parameters to enter a second phase of a process, which is then monitored until a second threshold value is reached. For example, temperature and/or cleaning gas concentration could be lowered to effect a more gentle cleaning environment.

Numerous modifications and variations of the present invention are possible in light of the above teachings. It is therefore to be understood that, within the scope of the appended claims, the invention may be practiced otherwise than as specifically described herein.

What is claimed is:

1. A method of removing fluoro-carbon polymer chamber residue from a plasma processing system, comprising:
   introducing a process gas into a process chamber of the plasma processing system, the process gas consisting of CO, or CO in combination with inert Ar gas;
   maintaining a pressure between 10 mTorr and 100 mTorr within the process chamber;
   generating a plasma from the process gas;
   exposing the fluoro-carbon polymer chamber residue to the plasma in a waferless dry cleaning process to form a volatile reaction product from the residue, where a shield wafer is not provided on a substrate holder of the plasma processing system so that the substrate holder is cleaned by the waferless dry cleaning process; and
   exhausting the reaction product from the process chamber, wherein the method of removing fluoro-carbon polymer chamber residue using a process gas consisting of CO or CO in combination with Ar results in reduced chamber residue when compared to a method of removing fluoro-carbon polymer chamber residue using a process gas consisting of Ar in combination with $O_2$.

2. The method according to claim 1, wherein the exposing further comprises providing a substrate on a substrate holder in the process chamber.

3. The method according to claim 1, further comprising performing at least one manufacturing process in the process chamber before repeating the introducing, generating, exposing, and exhausting.

4. The method according to claim 1, wherein the introducing comprises flowing the process gas at a gas flow rate between about 100 sccm and about 5,000 sccm.

5. The method according to claim 1, wherein the introducing comprises flowing the CO at a gas flow rate between about 100 sccm and about 2,000 sccm.

6. The method according to claim 1, wherein the introducing comprises flowing the inert Ar gas at a gas flow rate less than about 2,000 sccm.

7. The method according to claim 1, wherein the plasma processing system comprises upper and lower electrodes, and wherein the generating comprises applying RF frequency between about 1 MHz and about 100 MHz and RF power between about 100 W and about 4,000 W to the electrodes.

8. The method according to claim 7, wherein the RF frequency applied to the upper electrode is between about 40 MHz and about 80 MHz and the RF power applied to the upper electrode is between about 600 W and about 900 W, and wherein the RF frequency applied to the lower electrode is between about 1 MHZ and about 3 MHz and the RF power applied to the lower electrode is between about 100 W and about 400 W.

9. The method according to claim 1, wherein the exposing is carried out for a time period between about 2 seconds and about 240 seconds.

10. The method according to claim 1, wherein the exposing is carried out for a time period between about 15 seconds and about 40 seconds.

11. The method according to claim 1, further comprising:
    monitoring a signal from the plasma processing system, the signal being indicative of the progress of the dry cleaning method; and
    based upon the signal, performing one of the following:
       (a) continue performing the dry cleaning process and continue monitoring, or
       (b) stopping the cleaning process.

12. The method according to claim 11, wherein the monitoring further comprises determining if an intensity level of the signal has reached a threshold value.

13. The method according to claim 12, wherein performing (b) occurs after determining that the threshold value has been reached.

14. The method according to claim 11, wherein the monitoring comprises using an optical monitoring system to detect light emission from the process chamber.

15. The method according to claim 14, wherein the monitoring comprises monitoring emitted that light originates from at least one of carbon monoxide, fluorine, or silicon tetrafluoride.

16. The method according to claim 11, wherein the monitoring comprises using a mass sensor to detect a mass signal of a gas in the process chamber.

17. The method according to claim 11, wherein the monitoring comprises using a particle monitoring system to detect particle levels in the process chamber.

18. The method according to claim 11, wherein the monitoring comprises using a process parameter including at least one of RF generator peak-to-peak voltage or capacitor position in an impedance match network to detect a plasma condition in the process chamber.

19. A system for removing fluoro-carbon polymer chamber residue from a plasma processing system, comprising:
    a gas introduction system configured to introduce a process gas into a process chamber of the plasma processing system, the process gas consisting of CO or CO in combination with inert Ar gas;
    a pressure maintaining system which maintains a pressure between 10 mTorr and 100 mTorr within the process chamber,
    a plasma generating system configured to generate a plasma from the process gas such that the fluoro-carbon polymer chamber residue is exposed to the plasma in a waferless dry cleaning process to form a volatile reaction product from the residue, where a shield wafer is not provided on a substrate holder of the plasma processing system so that the substrate holder is cleaned by the waferless dry cleaning process; and a exhaustion system configured to exhaust the reaction product from the process chamber, wherein the system for removing fluoro-carbon polymer chamber residue using a process gas consisting of CO or CO in combination with Ar provides reduced chamber residue when compared to a system for removing fluoro-carbon polymer chamber residue using a process gas consisting of Ar in combination with $O_2$.

20. A system for removing fluoro-carbon polymer chamber residue from a plasma processing system, comprising:

means for introducing a process gas into a process chamber of the plasma processing system, the process gas consisting of CO or CO in combination with inert Ar gas;

means for maintaining a pressure between 10 mTorr and 100 mTorr within the plasma processing system, means for generating a plasma from the process gas such that the fluoro-carbon polymer chamber residue is exposed to the plasma in a dry cleaning process to form a volatile reaction product from the residue, where a shield wafer is not provided on a substrate holder of the plasma processing system so that the substrate holder is cleaned by the waferless dry cleaning process; and means for exhausting the reaction product from the process chamber, wherein the system for removing fluoro-carbon polymer chamber residue using a process gas consisting of CO or CO in combination with Ar provides reduced chamber residue when compared to a system for removing fluoro-carbon polymer chamber residue using a process gas consisting of Ar in combination with $O_2$.

21. The method of claim 1, wherein the process consists of equal flows of CO and Ar to achieve greater reduction in fluoro-carbon polymer chamber residue when compared to a method using process gas consisting of non-equal flows CO and Ar.

22. The method of claim 19, wherein the process consists of equal flows of CO and Ar to achieve greater reduction in fluoro-carbon polymer chamber residue when compared to a method using process gas consisting of non-equal flows CO and Ar.

23. The method of claim 20, wherein the process consists of equal flows of CO and Ar to achieve greater reduction in fluoro-carbon polymer chamber residue when compared to a method using process gas consisting of non-equal flow sCO and Ar.

* * * * *